US006853221B1

United States Patent
Wert

(10) Patent No.: US 6,853,221 B1
(45) Date of Patent: Feb. 8, 2005

(54) POWER-UP DETECTION CIRCUIT WITH LOW CURRENT DRAW FOR DUAL POWER SUPPLY CIRCUITS

(75) Inventor: Joseph D. Wert, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/037,180

(22) Filed: Oct. 23, 2001

(51) Int. Cl.[7] .............................................. H03L 7/00
(52) U.S. Cl. ..................... 327/143; 327/142; 327/198
(58) Field of Search ................................ 327/143, 198, 327/142, 530, 544

(56) References Cited

U.S. PATENT DOCUMENTS 4,948,995 A  *  8/1990  Takahashi ................... 327/142
5,519,347 A  *  5/1996  Kim ............................ 327/143
6,157,227 A  * 12/2000  Giovinazzi et al. ......... 327/143

* cited by examiner

Primary Examiner—Tuan T. Lam

(57) ABSTRACT

A power monitor circuit for notifying processing circuits operating from a first power supply (VDD) that a second power supply (VDDIO) is powered up. VDDIO is greater than VDD. The power monitor circuit comprises: 1) a voltage divider circuit coupled between the second power supply and ground having an output node that goes high when the second power supply is powered up; and 2) an odd number of serially connected inverters operating from the first power supply. An input of a first serially connected inverter is connected to the voltage divider circuit output node. An output of the last serially connected inverter produces a status signal that is the inverse of the voltage divider circuit output node. The status signal is an input to the voltage divider circuit that minimizes the voltage divider circuit—s current consumption when the second power supply is ON, while maintaining the status signal value.

22 Claims, 2 Drawing Sheets

POWER-UP DETECTION CIRCUIT WITH LOW CURRENT DRAW FOR DUAL POWER SUPPLY CIRCUITS

TECHNICAL FIELD OF THE INVENTION

The present invention is generally directed to integrated circuits and, in particular, to power up detection circuits for use in a dual power supply system.

BACKGROUND OF THE INVENTION

In recent years, there have been great advancements in the speed, power, and complexity of integrated circuits, such as application specific integrated circuit (ASIC) chips, random access memory (RAM) chips, microprocessor (uP) chips, and the like. These advancements have made possible the development of system-on-a-chip (SOC) devices. A SOC device integrates into a single chip all (or nearly all) of the components of a complex electronic system, such as a wireless receiver (i.e., cell phone, a television receiver, and the like). SOC devices greatly reduce the size, cost, and power consumption of the overall system.

Reductions in power consumption are particularly important in SOC devices. SOC devices are frequently used in portable devices that operate on battery power. Since maximizing battery life is a critical design objective in a portable device, it is essential to minimize the power consumption of SOC devices that may be used in the portable device. Furthermore, even if an SOC device is not used in a portable device, minimizing power consumption is still an important objective. The increased use of a wide variety of electronic products by consumers and businesses has caused corresponding increases in the electrical utility bills of homeowners and business operators. The increased use of electronic products also is a major contributor to the increased electrical demand that has caused highly publicized power shortages in the United States, particularly California.

To minimize power consumption in electronic devices, particularly SOC devices, many manufacturers have reduced the voltage levels at which electronic components operate. Low power integrated circuit (IC) technology operating at +3.3 volts replaced IC technology operating at +5.0 volts. The +3.3 volt IC technology was, in turn, replaced by +1.6 volt IC technology in many applications, particularly microprocessor and memory applications.

However, as the operating voltage of an integrated circuit is reduced, the noise margins of the integrated circuit are also reduced. Thus, an integrated circuit operating at +1.5 volts has smaller noise margins than a circuit operating at +3.3 volts. In deep submicron VLSI designs, two voltage sources for a chip design are common. One voltage source is an internal core power supply voltage (i.e., VDD) that has a lower swing voltage than the second voltage source, which provides the input/output (I/O) pad ring voltage (i.e., VDDIO). Common range values may include a VDD of 1–1.5 volts and a VDDIO range of 2.3–3.6 volts.

The internal core circuitry running on VDD typically uses thin gate oxides and cannot tolerate the higher external voltages of 2.3–3.6 volts. The transistors used in the pad rings, which interface off the chip to the board and surrounding chips, use a thicker gate oxide and larger minimum L than internal transistors and hence can handle the larger external voltages.

Many processing systems implement states in which the output power supply, VDDIO, is powered up while the internal core power supply, VDD, is zero, or, alternatively, states in which VDDIO is zero and VDD is powered up. FIG. 2 illustrates power monitor circuit 200 according to one embodiment of the prior art. Power monitor circuit 200 comprises resistor 205, resistor 210, capacitor 215, and an inverter formed by PMOS transistor 220 and NMOS transistor 225.

Power monitor circuit 200 monitors a power supply, VDDIO. When VDDIO is fully powered up, it is greater in voltage than another supply, VDD, which becomes valid sometime before VDDIO is powered up. The purpose of power monitor circuit 200 is to issue a high signal (i.e., a Logic 1) when VDD is valid and VDDIO is not and to issue a low signal (i.e., a Logic 0) when VDDIO becomes valid.

The most common way to detect a valid VDDIO is to use a voltage divider, such as the midpoint between resistors 205 and resistor 210, which serves as the input to the inverter formed by transistors 220 and 225. The ratio of resistors 205 and 210, and the sizing of transistors 220 and 225 determine the trip point where VDDIO is considered a high (Logic 1). Capacitor 215 may be placed on the input of the inverter to prevent power monitor circuit 200 from responding to noise on VDDIO as it powers up.

When VDDIO is initially OFF and VDD is initially ON, the input to the inverter is Logic 0 (i.e., grounded by resistor 210).

Hence the output, OUT, of the inverter is Logic 1. When VDDIO is ON, the voltage at the junction of resistors 205 and 210 goes to Logic 1 (since resistor 210 is typically much larger than resistor 205). Thus, the output, OUT, of the inverter is Logic 0. The problem with power monitor circuit 200 is that it burns DC current when VDDIO is ON.

Therefore, there is a need in the art for integrated circuits in which output line drivers may be powered up to a known state while internal core circuitry is not powered up. More particularly, there is a need for improved integrated circuits in which the output of a power supply for the output line drivers may be monitored without consuming an unnecessary amount of power.

SUMMARY OF THE INVENTION

To address the above-discussed deficiencies of the prior art, it is a primary object of the present invention to provide a power monitor circuit capable of notifying processing circuits operating from a first power supply having a VDD output voltage when a second power supply having a VDDIO output voltage is powered up, wherein VDDIO is greater than VDD. According to an advantageous embodiment of the present invention, the power monitor circuit comprises: 1) a voltage divider circuit coupled between the second power supply and ground and having an output node that rises to a high voltage when the second power supply is powered up; and 2) an odd number of serially connected inverters operating from the first power supply, wherein an input of a first of the serially connected inverters is connected to the voltage divider circuit output node and an output of a last of the serially connected inverters produces a status signal that is low when the voltage divider circuit output node is high and is high when the voltage divider circuit output node is low, and wherein the status signal is an input signal to the voltage divider circuit operable to minimize DC current consumption in the voltage divider circuit when the second power supply is powered up while maintaining a value of the status signal.

According to one embodiment of the present invention, the voltage divider circuit comprises: 1) a first N-channel transistor having a gate and a drain coupled to the VDDIO output voltage and a source coupled to the voltage divider circuit output node; 2) a second N-channel transistor having a gate coupled to the VDD output voltage and a drain coupled to the voltage divider circuit output node; and 3) a third N-channel transistor having a gate coupled to the status signal, a drain coupled to a source of the second N-channel transistor, and a source coupled to ground.

According to another embodiment of the present invention, the power monitor circuit further comprises a capacitor coupled between the voltage divider circuit output node and ground.

According to still another embodiment of the present invention, the power monitor circuit further comprises a fourth N-channel transistor having a gate coupled to the VDD output voltage, a drain coupled to the VDDIO output voltage, and a source coupled to the voltage divider circuit output node.

According to yet another embodiment of the present invention, the serially connected inverters comprise CMOS inverters.

According to a further embodiment of the present invention, the odd number of serially connected inverters comprises one CMOS inverter.

According to a still further embodiment of the present invention, the odd number of serially connected inverters comprises three CMOS inverters.

According to a yet further embodiment of the present invention, the odd number of serially connected inverters comprises five CMOS inverters.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent it document, those of ordinary skill in the art should understand that in many, if not most instances, such definitions apply to rag prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
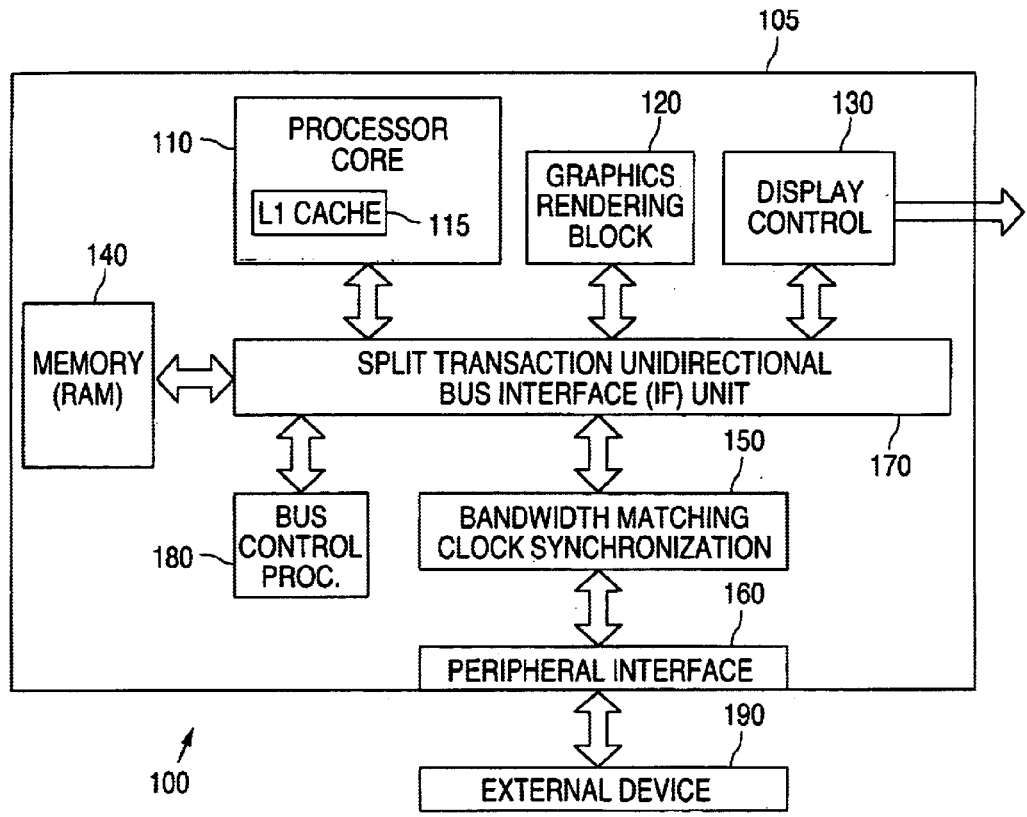
FIG. 1 illustrates a processing system which comprises an exemplary system-on-a-chip (SOC) device according to one embodiment of the present invention.
Figure 2:
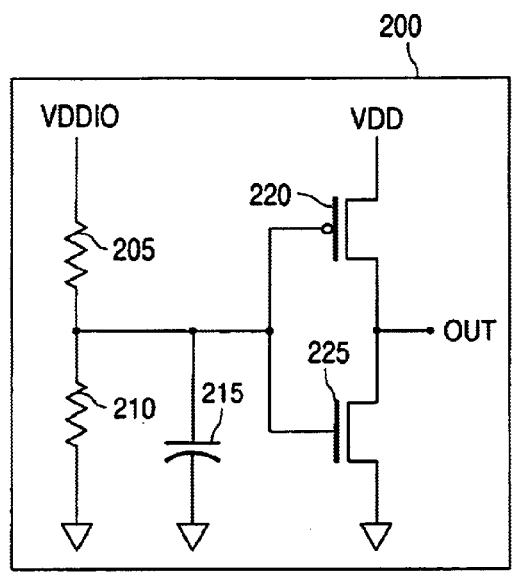
FIG. 2 illustrates a power monitor circuit according to one embodiment of the prior art.
Figure 3:
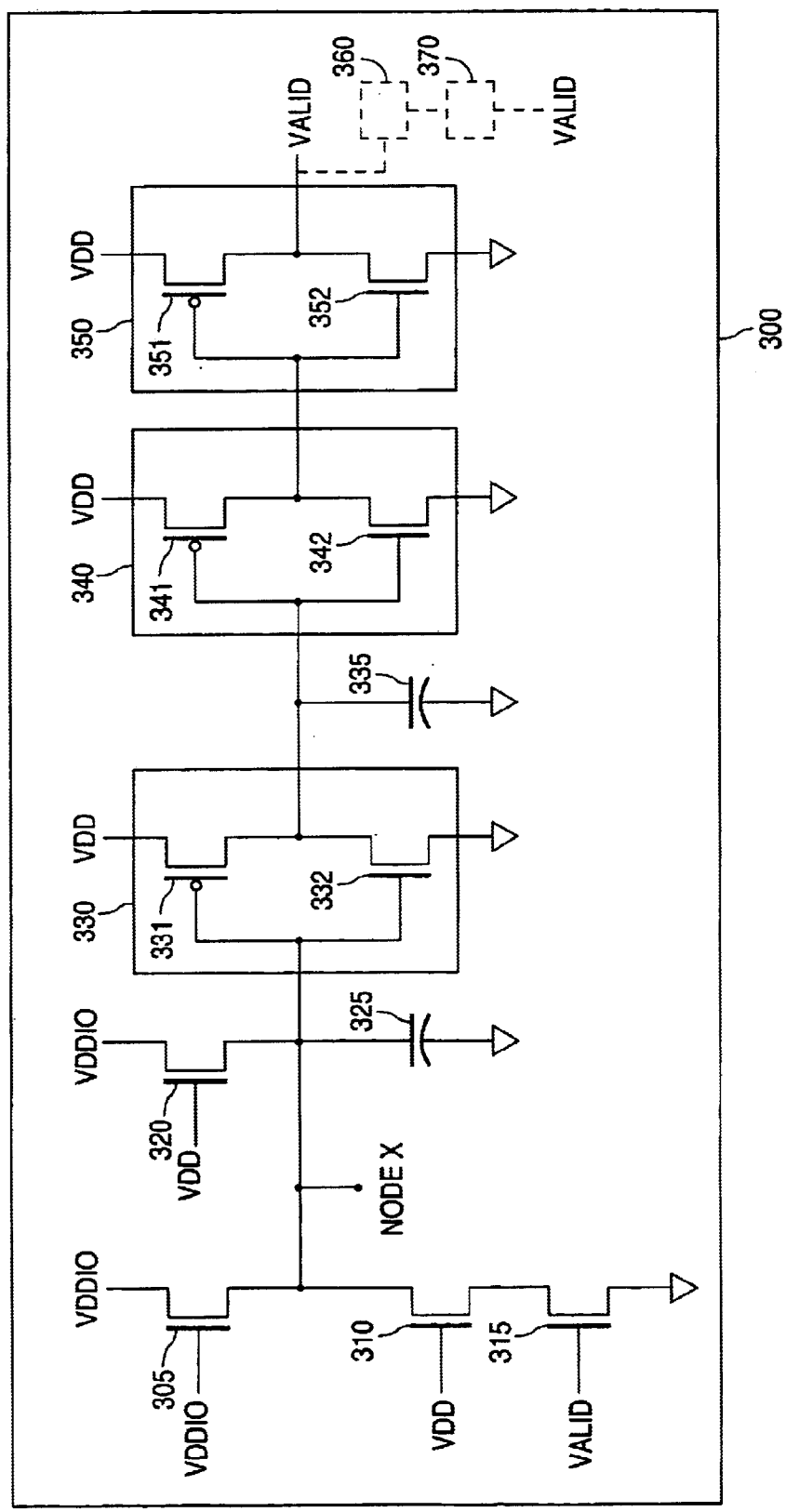
FIG. 3 illustrates a power monitor circuit according to an exemplary embodiment of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged data processing system.

FIG. 1 illustrates processing system 100, which comprises exemplary system-on-a-chip (SOC) device 105 according to one embodiment of the present invention. SOC device 105 is a single integrated circuit comprising processor core 110, graphics rendering block 120, (optional) display control circuit 130, memory 140, bandwidth matching-clock synchronization interface 150, peripheral interface 160, split transaction, unidirectional bus interface (IF) unit 170 (or bus IF unit 170), and bus control processor 180. Processor core 110 contains internal level one (L1) cache 115. Peripheral interface 160 communicates with external device 190.

Processing system 100 is shown in a general level of detail because it is intended to represent any one of a wide variety of electronic products, particularly consumer appliances. Display controller 130 is described above as optional because not all end-products require the use of a display. Likewise, graphics rendering block 120 may also be optional.

For example, processing system 100 may be a printer rendering system for use in a conventional laser printer. Processing system 100 also may represent selected portions of the video and audio compression-decompression circuitry of a video playback system, such as a video cassette recorder or a digital versatile disk (DVD) player. In another alternative embodiment, processing system 100 may comprise selected portions of a cable television set-top box or a stereo receiver.

Bus IF unit 170 provides high-speed, low latency communication paths between the components coupled to bus IF unit 170. Each component coupled to bus IF unit 170 is capable of initiating or servicing data requests via four unidirectional bus interfaces: two request buses and a two data buses. The is request bus contains address lines, byte enable lines (32-bit or 64-bit data reads), cycle type lines, and routing information for transactions. The data bus contains data lines, byte enable lines (for data writes), completion status lines, and routing information to associate the data bus packets with the appropriate request bus packet. As noted, the four buses are unidirectional and point-to-point to minimize loading and timing variations. In addition, bus IF unit 170 provides a diagnostic bus, power management controls, clocks, reset signals, and a scan interface.

Bus IF unit 170 implements a transaction protocol that defines the mechanism for transferring packets between devices coupled to bus IF unit 170. In addition, the transaction protocol defines the control for clocks and power management. The packet protocol standardizes the system level interactions between devices coupled to bus IF unit 170. The hardware requirements for mapping transactions, arbitrating packets, and maintaining coherency is specified in the packet protocol.

Bandwidth matching-clock synchronization interface 150 comprise a queue that bridges ports on bus IF unit 170 that have different widths or different frequencies, or both. Bus control processor 180 controls certain operations of bus IF unit 170 related to clock timing, power management, and diagnostic features. Peripheral interface 160 is a bus device used for chip-to-chip combination between SOC device 105 and an external peripheral device, such as external device 190.

In an advantageous embodiment of the present invention, SOC device 105 may use two VDD power supplies: an internal voltage supply (e.g., VDD=1V) to power internal logic and an input/output (I/O) voltage supply (e.g., VDDIO=3.3V) to power I/O lines that interface with external circuitry. For example, processor core 110 and bus IF unit 170 may operate at VDD=+1V and the output stage of peripheral interface 160 may operate at VDDI/O=+3.3V. Additionally, +3.3V circuitry may be used within SOC device 105 to drive selected internal address and data lines.

For example, if memory (i.e., RAM) 140 is large and separated from bus IF unit 170, the address and data lines of memory 140 may be driven by +3.3V power supply rails.

The present invention provides a power monitor circuit that monitors the VDDIO power supply to detect a power up after the VDD power supply has powered up. The present invention detects when VDDIO has risen to a predetermined voltage level and as generates a VALID signal that operates as a status signal for the core circuitry operating from the VDD power supply. Thus, the status signal (i.e., VALID signal) indicates that the circuitry operating from the VDDIO power supply is ready to communicate with the core circuitry. As will be explained below, the status signal also cuts off additional DC current usage in the power monitor circuit. VDDIO must drop to a low voltage to reset the power monitor circuit.

According to an advantageous embodiment, the present invention provides a power monitor circuit that notifies processing circuits operating from a first power supply having a VDD output voltage when a second power supply having a VDDIO output voltage is powered up, wherein VDDIO is greater than VDD.

The power monitor circuit comprises: 1) a voltage divider circuit coupled between the second power supply and ground that has an output node that rises to a high voltage when the second power supply is powered up; and 2) an odd number of serially connected-inverters operating from the first power supply. An input of the first of the serially connected inverters is connected to the voltage divider circuit output node and an output of the last of the serially connected inverters produces a status signal that is low when the voltage divider circuit output node is high and is high when the voltage divider circuit output node is low. The status signal is an input signal to the voltage divider circuit that minimizes DC current consumption in the voltage divider circuit when the second power supply is powered up.

According to an advantageous embodiment, the voltage divider circuit comprises: 1) a first N-channel transistor having a gate and a drain coupled to the VDDIO output voltage and a source coupled to the voltage divider circuit output node; 2) a second N-channel transistor having a gate coupled to the VDD output voltage and a drain coupled to the voltage divider circuit output node; and 3) a third N-channel transistor having a gate coupled to the status signal, a drain coupled to a source of the second N-channel transistor, and a source coupled to ground.

FIG. 3 illustrates exemplary power monitor circuit 300 according to an advantageous embodiment of the present invention. Power monitor circuit 300 comprises N-channel transistor 305, N-channel transistor 310, N-channel transistor 315, N-channel transistor 320, and capacitor 325. Power monitor circuit 300 further comprises three complementary metal-oxidesilicon (CMOS) inverters, that are serially connected to each other, and optional noise capacitor 335. CMOS inverter 330 comprises P-channel transistor 331 and N-channel transistor 332. CMOS inverter 340 comprises P-channel transistor 341 and N-channel transistor 342. Finally, CMOS inverter 350 comprises P-channel transistor 351 and N-channel transistor 352. The output of CMOS inverter 350 is the status signal (i.e., VALID) that cuts off DC current in power monitor circuit 300. As will be seen below, the VALID signal is an active low signal that goes low to indicate that VDDIO is powered up and goes high to indicate that VDDIO is not powered up. As shown by the dashed lines in FIG. 3, additional inverters 360, 370 could be used in the power monitor circuit 300, and the VALID signal would be produced by the inverter 370 rather than the inverter 350.

The gate and the drain of transistor 305 are connected to VDDIO, and the source of transistor 305 is connected to Node X. The gate of transistor 310 is connected to VDD and the drain of transistor 310 is connected to Node X. The gate of transistor 315 is connected to the VALID signal, the drain of transistor 315 is connected to the source of transistor 310, and the source of transistor 315 is grounded. The gate of transistor 320 is connected to VDD, the drain of transistor 320 is connected to VDDIO, and the source of transistor 320 is connected to Node X.

N-channel transistors 305, 310, and 315 detect when VDDIO is powered up. All three of these transistors are N-channel, and have the same models. This was chosen so as not to mix P-channel and N-channel devices because across process models and temperatures the differences between P-channel devices and N-channel devices can cause the resistor divide action to vary. The channel resistance of N-channel transistor 315 is almost negligible compared to the channel resistances of N-channel transistors 305 and 310. N-channel transistor 320 also has a relatively high channel resistance.

Initially, VDD and VDDIO are both OFF (i.e., 0 volts). Thus, Node X is initially at 0 volts. VDD turns ON (i.e., goes high) first. Node X is initially held at ground by capacitor 325. Also, when VDD goes high, transistor 320 is turned ON, shorting Node X to VDDIO, which is still 0 volts. All three CMOS inverters are powered up when VDD turns ON. Since Node X is low and is connected to the input of CMOS inverter 330, the output of CMOS inverter 330 goes high. When the output of CMOS inverter 330 goes high, the output of CMOS inverter 340 goes low. When the output of CMOS inverter 340 goes low, the output of CMOS inverter 350 goes high. Thus, the VALID signal goes high when VDD is ON and VDDIO is OFF.

Since VDD is ON and the VALID signal is high, transistors 310 and 315 are ON and Node X is essentially connected to ground by the channel resistances of transistors 310 and 315. Since VDDIO is OFF, transistor 305 is OFF. At some point thereafter, the VDDIO supply turns ON (i.e., goes to high voltage, such as 3.3 volts).

As VDDIO ramps up, transistor 305 turns ON and the voltage divider across N-channel transistors 305 and 310 pulls Node X up to a relatively high voltage. When Node X goes high, the output of CMOS inverter 330 goes low. When the output of CMOS inverter 330 goes low, the output of CMOS inverter 340 goes high. When the output of CMOS inverter 340 goes high, the output of CMOS inverter 350 goes low. Thus, the VALID signal goes low.

When the VALID signal goes low, this voltage is fed back to the gate of N-channel transistor 315, which turns OFF and stops the VDDIO current use through transistors 305, 310, and 315. Also, CMOS inverters 330, 340, and 350 consume no current when the outputs of those devices are either stuck high or stuck low.

So long as VDDIO stays high, the power monitor circuit 300 consumes no current.

N-channel transistor 320 also acts as a turn-off when VDDIO goes low. Without N-channel transistor 320, if VDDIO were powered up, then powered down, and then powered up again without a long period of time in the OFF state, Node X would not have time to go high, which would defeat its operation. If sufficient time is allowed, Node X would eventually go to ground due to leakage, but N-channel transistor 320 ensures that should VDDIO power down and then power up within a few milliseconds, power monitor circuit 300 will functional properly. Optional capacitor 335 may be included to prevent noise or fluctuations that may occur when either VDD or VDDIO is powering up from causing an erroneous change in the state of the VALID signal.

Those skilled in art will recognize that the use of three CMOS inverters in power monitor circuit 300 is by way of example only. Multiple CMOS inverters are used to sharpen the rise times and fall times of the voltage at Node X. In alternate embodiments, other odd numbers of CMOS inverters may be used. Thus, power monitor circuit 300 may comprise one, three, five, seven, or more CMOS inverters.

Although the present invention has been described in detail, is those skilled in the art should understand that they can make various changes, substitutions and alterations herein without departing from the spirit and scope of the invention in its broadest form.

What is claimed is:

1. A power monitor circuit operable to notify processing circuits operating from a first power supply having a VDD output voltage when a second power supply having a VDDIO output voltage is powered up, wherein VDDIO is greater than VDD, said power monitor circuit comprising:
   a voltage divider circuit coupled to said first power supply and said second power supply and between said second power supply and ground, said voltage divider circuit having an output node that rises to a high voltage when said second power supply is powered up; and
   one or more inverters operating from said first power supply, said one or more inverters comprising an odd number of serially connected inverters, wherein an input of one of said one or more inverters is connected to said voltage divider circuit output node and an output of one of said one or more inverters produces a status signal that is low when said voltage divider circuit output node is high and is high when said voltage divider circuit output node is low, and wherein said status signal is an input signal to said voltage divider circuit operable to minimize DC current consumption in said voltage divider circuit when said second power supply is powered up while maintaining a value of said status signal.

2. The power monitor circuit as set forth in claim 1 wherein said one or more serially connected inverters comprise one or more CMOS inverters.

3. The power monitor circuit as set forth in claim 1 wherein said voltage divider circuit comprises: 1) a first N-channel transistor having a gate and a drain coupled to said VDDIO output voltage and a source coupled to said voltage divider circuit output node; 2) a second N-channel transistor having a gate coupled to said VDD output voltage and a drain coupled to said voltage divider circuit output node; and 3) a third N-channel transistor having a gate coupled to said status signal, a drain coupled to a source of said second N-channel transistor, and a source coupled to ground.

4. The power monitor circuit as set forth in claim 3 further comprising a capacitor coupled between said voltage divider circuit output node and ground.

5. The power monitor circuit as set forth in claim 4 further comprising a fourth N-channel transistor having a gate coupled to said VDD output voltage, a drain coupled to said VDDIO output voltage, and a source coupled to said voltage divider circuit output node.

6. The power monitor circuit as set forth in claim 1 wherein said odd number of serially connected inverters comprises one inverter.

7. The power monitor circuit as set forth in claim 6 wherein said odd number of serially connected inverters comprises one CMOS inverter.

8. The power monitor circuit as set forth in claim 1 wherein said odd number of serially connected inverters comprises three inverters.

9. The power monitor circuit as set forth in claim 8 wherein said odd number of serially connected inverters comprises three CMOS inverters.

10. The power monitor circuit as set forth in claim 1 wherein said odd number of serially connected inverters comprises five inverters.

11. The power monitor circuit as set forth in claim 10 wherein said odd number of serially connected inverters comprises five CMOS inverters.

12. An integrated circuit comprising:
    core processing circuitry operating from a first power supply having a VDD output voltage;
    output stage circuitry operating from a second power supply having a VDDIO output voltage, wherein VDDIO is greater than VDD; and
    a power monitor circuit operable to notify said core processing circuitry when said second power supply having said VDDIO output voltage is powered up, said power monitor circuit comprising:
        a voltage divider circuit coupled to said first power supply and said second power supply and between said second power supply and ground, said voltage divider circuit having an output node that rises to a high voltage when said second power supply is powered up; and
        one or more inverters operating from said first power supply, said one or more inverters comprising an odd number of serially connected inverters, wherein an input of one of said one or more inverters is connected to said voltage divider circuit output node and an output of one of said one or more inverters produces a status signal that is low when said voltage divider circuit output node is high and is high when said voltage divider circuit output node is low, and wherein said status signal is an input signal to said voltage divider circuit operable to minimize DC current consumption in said voltage divider circuit when said second power supply is powered up while maintaining a value of said status signal.

13. The integrated circuit as set forth in claim 12 wherein said one or more serially connected inverters comprise one or more CMOS inverters.

14. The integrated circuit as set forth in claim 12 wherein said voltage divider circuit comprises: 1) a first N-channel transistor having a gate and a drain coupled to said VDDIO output voltage and a source coupled to said voltage divider circuit output node; 2) a second N-channel transistor having a gate coupled to said VDD output voltage and a drain coupled to said voltage divider circuit output node; and 3) a third N-channel transistor having a gate coupled to said status signal, a drain coupled to a source of said second N-channel transistor, and a source coupled to ground.

15. The integrated circuit as set forth in claim 14 further comprising a capacitor coupled between said voltage divider circuit output node and ground.

16. The integrated circuit as set forth in claim 15 further comprising a, fourth N-channel transistor having a gate coupled to said VDD output voltage, a drain coupled to said VDDIO output voltage, and a source coupled to said voltage divider circuit output node.

17. The integrated circuit as set forth in claim 12 wherein said odd number of serially connected inverters comprises one inverter.

18. The integrated circuit as set forth in claim 17 wherein said odd number of serially connected inverters comprises one CMOS inverter.

19. The integrated circuit as set forth in claim 12 wherein said add number of serially connected inverters comprises three inverters.

20. The integrated circuit as set forth in claim 19 wherein said odd number of serially connected inverters comprises three CMOS inverters.

21. The integrated circuit as set forth in claim 12 wherein said odd number of serially connected inverters comprises five inverters.

22. The integrated circuit as set forth in claim 21 wherein said odd number of serially connected inverters comprises five CMOS inverters.

* * * * *

UNITED STATES PATENT AND TRADEMARK OFFICE
CERTIFICATE OF CORRECTION

PATENT NO. : 6,853,221 B1
DATED : February 8, 2005
INVENTOR(S) : Joseph D. Wert

It is certified that error appears in the above-identified patent and that said Letters Patent is hereby corrected as shown below:

Column 3,
Line 63, delete "it" after "patent";
Line 65, delete "rag" after "to";

Column 7,
Line 44, delete "is" before "those";

Column 10,
Line 13, delete "add" and replace with -- odd --.

Signed and Sealed this

Fourth Day of April, 2006

JON W. DUDAS
*Director of the United States Patent and Trademark Office*